United States Patent [19]
Hosokawa et al.

[11] 3,875,563
[45] Apr. 1, 1975

[54] SEMICONDUCTOR INTEGRATED CIRCUIT DEVICE SERVING AS SWITCH MATRIX CIRCUIT

[75] Inventors: Yoshikazu Hosokawa; Tatsuya Kamei, both of Hitachi, Japan

[73] Assignee: Hitachi Ltd., Tokyo, Japan

[22] Filed: Feb. 5, 1974

[21] Appl. No.: 439,701

[30] Foreign Application Priority Data

Feb. 7, 1973 Japan .......................... 48-14634

[52] U.S. Cl. .......................................... 340/166 R
[51] Int. Cl. .......................................... H04q 3/00
[58] Field of Search .......... 307/239, 241; 340/166 R

[56] References Cited

UNITED STATES PATENTS 3,639,908 2/1972 Hovagimyan .................. 340/166 R

*Primary Examiner*—Harold I. Pitts
*Attorney, Agent, or Firm*—Craig & Antonelli

[57] ABSTRACT

In the integration of a switch matrix circuit consisting of semiconductor elements, a new arrangement of switches. Common connections and cross-over wirings are employed to reduce the number of pads on the semiconductor substrate and to minimize the potential difference between cross-over wirings, so that a semiconductor integrated circuit device having a simple structure and a high rate of integration can be obtained.

4 Claims, 8 Drawing Figures

FIG. 1
PPIOR ART
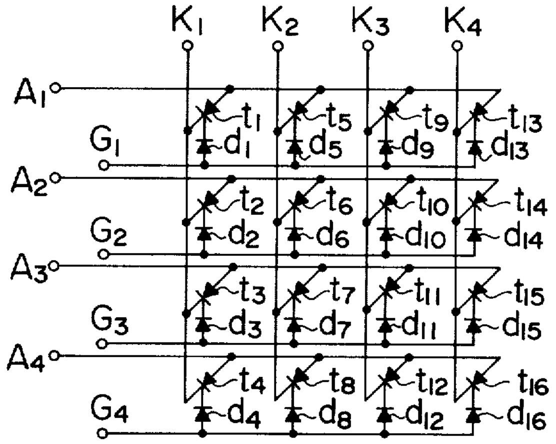
FIG. 2
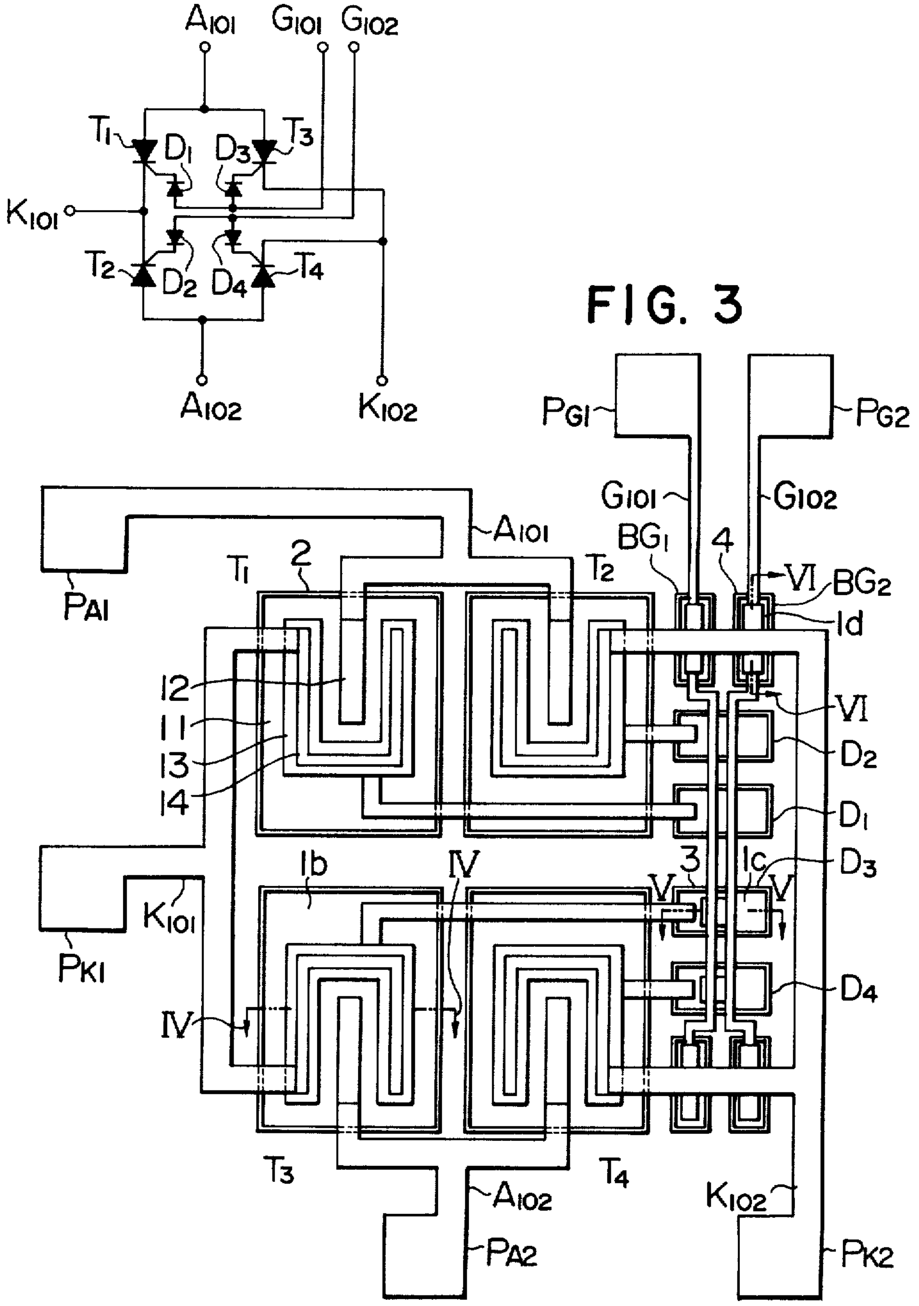
FIG. 3

SEMICONDUCTOR INTEGRATED CIRCUIT DEVICE SERVING AS SWITCH MATRIX CIRCUIT

BACKGROUND OF THE INVENTION

1. Field of the Invention

The present invention relates to a semiconductor integrated circuit device, and more particularly to a wiring arrangement of a switch matrix circuit.

2. Description of the Prior Art

A switch matrix circuit has a plurality of X-axis input lines and a plurality of Y-axis output lines connected through switches, each X-axis input line being connectable with any Y-axis line through a switching element and vice versa. In such a switch matrix circuit, a desired X-axis input line and a Y-axis output line can be electrically communicated with each other by selectively controlling the switches so that electric signals can be sent only through a desired line.

Usually, transistors or thyristors are used as such switches for the switch matrix circuit.

For example, FIG. 1 shows a conventional 4 × 4 switch matrix circuit consisting of four X-axis lines and four Y-axis lines, in which thyristors are used as switching elements.

Namely, anode terminal lines $A_1 - A_4$ which are the X-axis inout lines and cathode terminal lines $K_1 - K_4$ which are the Y-axis output lines are connected through thyristor switches $t_1 - t_{16}$. Any desired thyristor can be fired, that is, electric signals can be sent only through a desired line by sending a control signal through a corresponding one of the gate terminal lines $G_1 - G_4$ which serve as control signal input lines and associate some of the diodes $d_1 - d_{16}$ and simultaneously by selecting one of the Y-axis output lines $K_1 - K_4$.

In the figure, the numeral subscripts attached to the letters A, K and G are to be considered as the numbers indicating the groups of common connection.

In the semiconductor integrated circuit device, all the electrodes to be connected with the terminals of the active or passive elements are provided only on one of the principal surfaces of the semiconductor substrate. This structure is generally adopted in the field of the art.

Accordingly, in case where two wiring lines made of thin metal film such as aluminum foil and connecting the active or passive elements, spatially intersect each other, a cross-over wiring method is employed in which an insulating film is interposed between the two lines.

In the field of semiconductor technology, the semiconductor oxide film i.e., silicon oxide film, provided on the semiconductor element can be preferably used as such an insulating film, in order to improve other characteristics of the semiconductor element. With such silicon oxide film, however, the withstand voltage per unit thickness falls short of a satisfactory value and moreover the thickness of the film is limited by other requirements. Therefore, the insulation of the terminal lines the voltage difference between which is great, with such silicon oxide film tends to be broken down. For this reason, the cross-over wiring is not recommended.

In place of the cross-over wiring, for example, there are used terminal take-out pads provided about the integrated active or passive elements. The electrodes of the elements are individually connected with the corresponding pads and then common wiring is performed outside the pads.

According to this artifice, however, there are left a few drawbacks as follows. Too many pads are needed and the fabrication of the semiconductor device and the wiring become complicated. Moreover, the rate of integration, which is the rate of how many semiconductor elements are integrated within a unit area, falls lower and therefore the resultant semiconductor device has a larger size.

SUMMARY OF THE INVENTION

One object of the present invention is to provide a semiconductor integrated circuit device having a high rate of integration, which is simplified in structure by reducing the number of pads by employing both common wirings and cross-over wirings in the semiconductor substrate.

Another object of the present invention is to provide a semiconductor integrated circuit device serving as a $2m \times 2n$ ($m$, $n$, being integers such that $m, n \geq 1$) switch matrix circuit consisting of a plurality of units each, in its smallest form, being a 2 × 2 switch matrix having two X-axis input lines and two Y-axis output lines, and having a simple structure with a smaller number of pads.

According to the present invention, four separate semiconductor switches each formed in each of four blocks defined through crosswise division of each of arrayed rectangular section of a semiconductor substrate are used as fundamental units, the common conductors being provided to connect every two of the four input lines and the four output lines of the four semiconductor switches, and only one common conductor which has the lowest potential among the common conductors against conductors connected to the control terminals of the switches is arranged in cross-over configuration with respect to the control conductors.

In this specification and the claims, reference to a common conductors should be construed to include not only the common or main portion of the conduction but also branch portions directly extending from the common portion.

BRIEF DESCRIPTION OF THE DRAWING

FIG. 1 is an electrical wiring diagram of a conventional switch matrix circuit using thyristors as its switching elements.

FIG. 2 is a wiring diagram of a 2 × 2 switch matrix circuit forming a unit of a semiconductor integrated circuit device according to the present invention.

FIG. 3 is a plan view of the switch matrix circuit shown in FIG. 2 as an integrated semiconductor device fabricated according to the present invention.

DESCRIPTION OF THE PREFERRED EMBODIMENTS

FIG. 2 shows a fundamental circuit of a 2 × 2 switch circuit consisting of two anode terminal lines $A_{101}$, $A_{102}$ which are the X-axis input lines, two cathode terminal lines $K_{101}$, $K_{102}$ which are the Y-axis output lines and P-gate type thyristors $T_1 - T_4$ with gate terminal lines $G_{101}$, $G_{102}$ provided in the P-layer. This circuit in FIG. 2 is laid off in view of the circuit configuration of the device shown in FIG. 3.

Namely, since the potential difference between the gate and the cathode terminals is smaller than that between the anode and the cathode terminals in the P-gate type thyristor, it is one of the requirements in the present invention to subject the gate terminal lines $G_{101}$ and $G_{102}$ and the cathode terminal lines $K_{101}$ and $K_{102}$ to cross-over wiring.

There is another requirement in order to attain a preferable wiring to connect the anodes and the cathodes of the thyristors $T_1 - T_4$ and to connect the gate electrodes of the thyristors $T_1 - T_4$ with the pads, the requirement consisting of locating the thyristors $T_1 - T_4$ equidistantly apart from one another or placing them in four blocks defined through crosswise division of the substrate with a constant distance maintained between one thyristor and another, commonly connecting the anode of the thyristor $T_1$ and the anode of the thyristor $T_3$ to a common anode terminal line $A_{101}$ while the anodes of the thyristors $T_2$ and $T_4$ are commonly connected to a common anode terminal line $A_{102}$, and commonly connecting the cathode of the thyristor $T_1$ and the cathode of the thyristor $T_2$ to a common cathode terminal line $K_{101}$ while the cathodes of the thyristors $T_3$ and $T_4$ are commonly connected to a common cathode terminal line $K_{102}$.

FIG. 3 is a plan view of a semiconductor integrated circuit as a concrete example of the fundamental 2 × 2 switch matrix shown in FIG. 2: that is, FIG. 3 shows one principal surface of the semiconductor substrate in which the thyristors $T_1 - T_4$ are integrated.

The thyristors $T_1 - T_4$ are located on the substrate 1, separated by a predetermined distance from one another, or placed in four blocks defined through crosswise division of the substrate surface. The thyristors $T_1 - T_4$ are insulated by silicon oxide film 2 as insulating layer, from one another and from the substrate 1.

Figure 4:
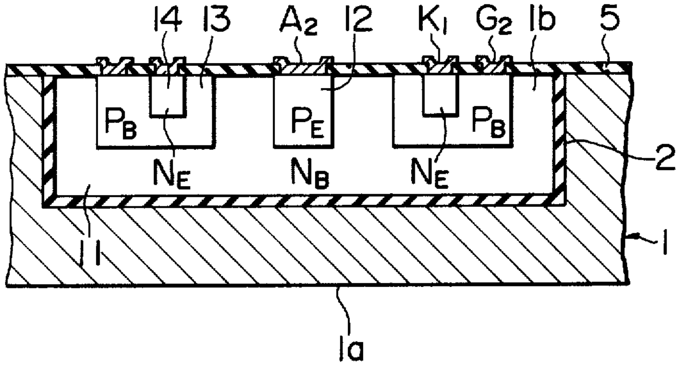
FIG. 4. is a cross section taken along line IV—IV in FIG. 3, showing switching thyristors.

As shown in FIG. 4, the semiconductor substrate 1 consists of a polycrystalline region 1*a* and plurality of single crystal region 1*b* formed in the substrate 1 and insulated from the polycrystalline region 1*a* by the oxide film 2, the exposed surfaces of the single crystal regions 1*b* being in the principal surface of the substrate 1. In FIG. 4, in fact, only one of the single crystal regions 1*b* is shown.

The upper principal surface of the semiconductor substrate 1 is coated with silicon oxide film 5. The single cyrstal region 1*b* has the N-type conductivity and serves as the $N_B$ layer 11 of the thyristor $T_3$ in the case where the switching thyristor $T_3$ having a lateral structure is formed in the region 1*b*.

A stripe-shaped portion of the silicon oxide film 5 in the center of the single crystal region 1*b* is removed and P-type impurities are diffused into the region 1*b* through the bare surface formed as a result of the removal of the oxide film, to form a $P_E$ layer 12.

At the same time, another portion of the silicon oxide film 5, in the shape of flat-bottomed *ju:* U, with the region of the $P_E$ layer embosomed in the center of the U, is removed and in like manner P-type impurities are diffused to form a $P_B$ layer 13.

Then, the portion of the silicon oxide film 5 on and along the $P_B$ layer 13 is removed so that N-type impurities are diffused through the exposed surface to form a $N_E$ layer 14.

Next, the portions of silicon oxide film 5 on the $P_E$ layer 12, the $P_B$ layer 13 and the $N_E$ layer 14 are removed corresponding to the shapes of electrodes attached to the layers, to partially expose the single crystal region 1*b* to the atmosphere.

Now, aluminum is vapor-deposited on the surface of the substrate 1 treated as above and having silicon oxide film 5 left partially thereon, to form aluminum layer having a predetermined thickness. Some portions of the aluminum layer are removed through photoresist-etching techniques so that a pattern of aluminum film, as shown in FIG. 3, including electrodes and common wiring lines $A_{102}$, $K_{101}$ and $G_{102}$ is formed.

Namely, the anode, cathode and gate electrodes attached to the respective layers of the thyristor $T_3$ and the anode, cathode and gate terminal lines are integrally formed through aluminum film wiring technique.

The wiring of the respective electrodes and lines and the structures, of the other thyristors $T_1$, $T_2$ and $T_4$ are the same as in the case of the thyristor $T_3$ and the detailed description thereof will be omitted.

The structures of the thyristors $T_1 - T_4$ are as shown in FIG. 3 in view of the requirement that the cathode terminal lines and the gate terminal lines should be in cross-over wiring configuration. Namely, the anode terminal lines $A_{101}$ and $A_{102}$ extend oppositely on the silicon oxide film 5 on the substrate 1 while the cathode terminal lines and the gate terminal lines, which are arranged in cross-over configuration, extend perpendicular to the direction of the extension of the anode terminal lines $A_{101}$ and $A_{102}$. The terminal lines are connected to respective pads. Namely, as shown in FIG. 3, pads $P_{A1}$, $P_{A2}$, $P_{K1}$, $P_{K2}$, $P_{G1}$ and $P_{G2}$ are provided respectively for anode terminal lines $A_{101}$, $A_{102}$, cathode terminal lines $K_{101}$, $K_{102}$ and gate terminal lines $G_{101}$, $G_{102}$. The pads are disposed in the vicinity of each four-switch unit and formed on the silicon oxide film 5 so as to be insulated from the semiconductor substrate 1. The pads may be formed concurrently with the formation of the terminal lines using the aluminum wiring technique. It will be understood that the pads are connected by means of soldered gold wires to external terminals provided on a case of the device (not shown).

The exposed end portions of the junctions between the $P_E$ and $N_B$ layers 12 and 11, between the $N_B$ and $P_B$ layers 11 and 13, and between the $P_B$ and $N_E$ layers 13 and 14, of the thyristors $T_1 - T_4$ are all coated and protected with the silicon oxide film 5 as shown in FIG. 4, but in FIG. 3, in order to show clearly the patterns of the $P_E$, $N_B$, $P_B$ and $N_E$ layers 12, 11, 13, and 14, the silicon oxide film 5 and the anode, cathode and gate electrodes provided on the respective layers are taken away.

The cross-over wiring will be described with the aid of FIGS. 5 and 6.

Figure 5:
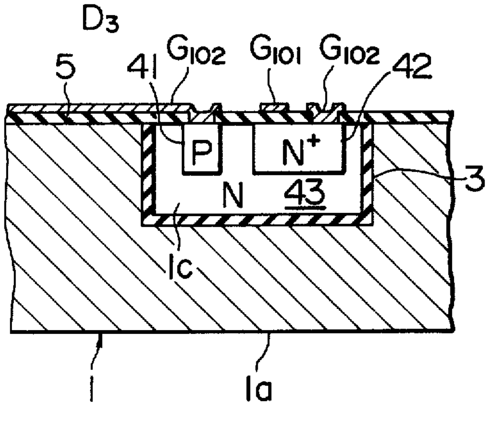
FIG. 5 is a cross section taken along line V—V in FIG. 3, showing a diode.

FIG. 5 illustrates the cross-over wiring arrangement located over an integrated diode provided at the gate terminal of the thyristor; that is, FIG. 5 is a cross section taken along line V—V in FIG. 3; and diodes $D_1$ – $D_4$ formed in the single crystal regions 4c of the semiconductor substrate 1 are respectively enclosed by insulating film 3 of silicon oxide to be insulated from one another.

The diode $D_3$, for example, as shown in FIG. 5 consists of a P-type layer 41 to which the gate terminal line $G_{102}$ is connected, a high concentration N-type layer 42 and an N-type layer 43 interposed between them. The P layer 41 and the high concentration N layer 42 are formed respectively by diffusing P-type and N-type impurities into the single crystal region 1c serving as the N layer 43.

The steps of fabrication can be reduced if the diffusion of the impurities to form the diodes is performed simultaneously with the diffusion process of the thyristors $T_1$ – $T_4$.

The exposed ends of the junction of the P layer 41 and the N layer 43 and the exposed portions of these layers except those to which the aluminum electrodes are attached are covered by the silicon oxide film 5 and the gate terminal line $G_{101}$ extends on the portion of the film 5 lying on the high concentration N layer 42 to form a cross-over wiring arrangement.

The other diodes $D_1$, $D_2$ and $D_4$ have the same structure as the diode $D_3$ and the description of the structures thereof will be needless.

Figure 6:
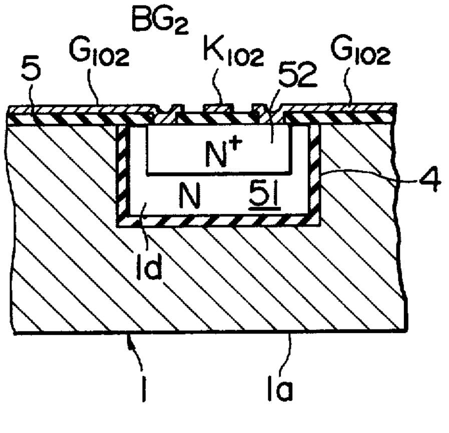
FIG. 6 is a cross section taken along line VI—VI in FIG. 3, showing a bridge line portion.

FIG. 6 shows the cross-over wiring arrangement of the gate and the cathode terminal lines $G_{102}$ and $K_{102}$; that is, FIG. 6 is a cross section taken along line VI—VI in FIG. 3.

In FIG. 6, the cathode terminal line $K_{102}$ extends on the silicon oxide film 5 lying on the semiconductor substrate 1 and the gate terminal line $G_{102}$ is insulated by means of the silicon oxide film 5, so that the gate terminal line $G_{102}$ and the cathode terminal line $K_{102}$ are arranged in cross-over wiring configuration by means of a bridge wiring member $BG_2$ consisting of the N layer 51 and the high concentration N layer 52 formed in the single crystal region 1d of the semiconductor substrate 1.

Like the thyristors $T_1$ – $T_4$ and the diodes $D_1$ – $D_4$, the bridge members $BG_1$ and $BG_2$ are insulated from each other and from the semiconductor substrate 1 since the single crystal regions 1d are enclosed by the silicon oxide film 4.

The potential difference between the gate and the cathode terminal lines $G_{102}$ and $K_{102}$ is larger than that between the cathode terminal lines $G_{101}$ and $G_{102}$ shown in FIG. 5 but much smaller than that between the anode and the cathode terminal lines, so that the cross-over wiring of the gate and the cathode terminal lines $G_{102}$ and $K_{102}$ can be securely formed with a thin silicon oxide film.

The features of the present invention are in the arrangement and structure of the semiconductor switches such as thyristors and in the way of taking out the common terminal lines, but not in the disposition of the diodes provided in the control terminal lines of the thyristors.

Accordingly, various modifications are possible by, for example, controlling the locations of the diodes used in the embodiment shown in FIG. 3.

For example, the diodes $T_1$ – $T_4$ may be disposed outside the thyristors $T_1$ and $T_2$ or the thyristors $T_3$ and $T_4$, parallel to the line connecting the thyristors $T_1$ and $T_2$ or the thyristors $T_3$ and $T_4$ and it is also at the designer's disposal to omit the bridge wiring member $BG_1$ and $BG_2$.

In such a cross-over wiring configuration as described above, the lines to be crossed over by each other may be insulated from each other by a silicon oxide film other than the silicon oxide film 5 covering the upper principal surface of the semiconductor substrate 1.

Figure 7:
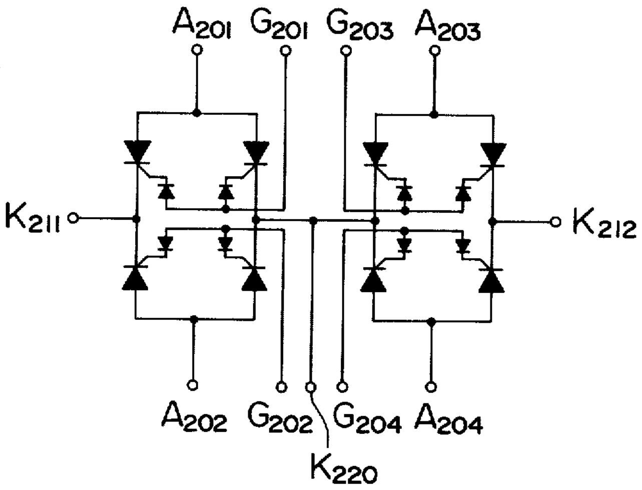
FIG. 7 is a wiring diagram of a 2 × 4 switch matrix circuit attainable with the semiconductor integrated circuit device shown in FIG. 2 or 3.
Figure 8:
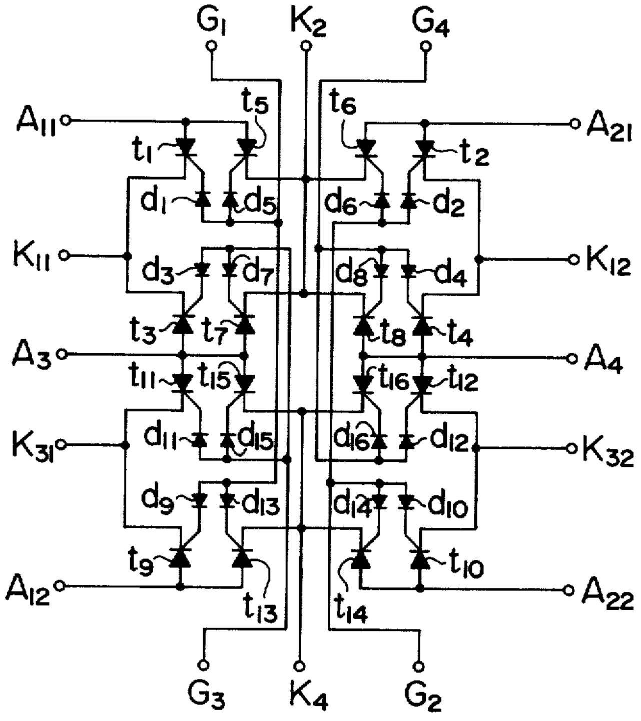
FIG. 8 is a wiring diagram of a 4 × 4 switch matrix circuit attainable with the semiconductor integrated circuit device shown in FIG. 2 or 3.

FIG. 7 shows a 2 × 4 switch matrix circuit consisting of two X-axis input lines and four Y-axis output lines while FIG. 8 illustrates a 4 × 4 switch matrix circuit consisting of four X-axis input lines and four Y-axis output lines, both the matrix circuits being arranged to correspond to the integrated circuit layouts thereof as in FIG. 2.

The circuit in FIG. 7 is obtained by connecting side by side two identical circuits, each being the same as that shown in FIG. 2 or 3, and by commonly connecting the cathode terminal lines $K_{102}$ to form a common terminal line $K_{220}$. The anode terminal lines and the gate terminal lines are indicated at $A_{201}$ – $A_{204}$ and $G_{201}$ – $G_{204}$, respectively.

The 4 × 4 switch matrix circuit shown in FIG. 8 is obtained by combining four identical units, each forming a 2 × 2 switch matrix circuit as shown in FIG. 2, and corresponds to a $2m \times 2n$ switch matrix circuit where $m = 2$ and $n = 2$.

This embodiment shown in FIG. 8 corresponds to the circuit shown in FIG. 1 and for convenience sake the thyristors and the diodes in FIG. 8 are labeled $t_1$ – $t_{16}$ and $d_1$ – $d_{16}$.

Although the anode terminal lines $A_{11}$, $A_{12}$, $A_{21}$ and $A_{22}$ and the cathode terminal lines $K_{11}$, $K_{12}$, $K_{31}$ and $K_{32}$ do not appear in FIG. 1, they correspond right to the anode and the cathode terminal lines $A_1$, $A_2$, $K_1$ and $K_2$ by electrically connecting the lines $A_{11}$ and $A_{12}$, $A_{21}$ and $A_{22}$, $K_{11}$ and $K_{12}$, and $K_{31}$ and $K_{32}$ outside the pads.

It is considered, in view of the relation between FIG. 2 and FIG. 3, that the integrated circuit layouts of the switch matrix circuit in FIGS. 7 and 8 can be easily drawn and the figures and descriptions of the layouts will be omitted.

As described above, by combining a plurality of fundamental matrix units one of which is shown in FIG. 2 or 3, a $2m \times 2n$ switch matrix circuit can be realized without any complicate wiring, and moreover the number of pads necessary for wiring can also be reduced through common connection so that the rate of integration can be improved.

We claim:

1. A semiconductor integrated circuit device serving as a switch matrix circuit having $2m$ ($m$ being an integer number) X-axis input lines and $2n$ ($n$ being an integer number) Y-axis output lines with a semiconductor switch between every X-axis input line and Y-axis output line for electrically connecting selected X-axis input lines and Y-axis output lines through the selective control of said semiconductor switches, said circuit comprising:

at least one fundamental unit consisting of four semiconductor switches each formed in each of the four blocks defined in a semiconductor substrate by crosswise division of rectangular sections of the substrate and insulated from one another;

a pair of input common conductors each connecting two of said four input lines of said four semiconductor switches and a pair of output common conductors each connecting two of said four output lines of said four semiconductor switches; and cross-over wiring arrangements participated by a pair of control common conductors each connecting two of the control terminals of said four semiconductor switches and by one of said input or output common conductors, the choice of said one common conductor participating the cross-over wiring depending on which is at the lowest potential with respect to said control common conductors among the input and output common conductors.

2. A semiconductor integrated circuit device as claimed in claim 1, wherein the branch portions of that one of said input or output common connection conductors which form the cross-over wiring arrangements with said control common conductors and the branch portions of said control common conductors are disposed on said substrate in perpendicular relation to the branch portions of that pair of said input or output common conductors which do not form cross-over wiring arrangements with said control common conductors and a pair of input or output common conductors which do not form cross-over wiring arrangements with said control common conductors are disposed on said substrate in opposite relation to each other and extending outwardly from said fundamental unit of switches.

3. A semiconductor integrated circuit device as claimed in claim 1, wherein the control terminals of each pair of semiconductor switches having their input lines connected commonly, are commonly connected.

4. A semiconductor integrated circuit device as claimed in claim 1, wherein said input and output common conductors are electrically connected with pads provided on said semiconductor substrate.

* * * * *